United States Patent
Ikehata et al.

(10) Patent No.: US 8,803,610 B2
(45) Date of Patent: Aug. 12, 2014

(54) SEMICONDUCTOR INTEGRATED CIRCUIT DEVICE

(75) Inventors: Natsuki Ikehata, Kanagawa (JP); Kazuo Tanaka, Kanagawa (JP); Takeo Toba, Kanagawa (JP); Masashi Arakawa, Kanagawa (JP)

(73) Assignee: Renesas Electronics Corporation, Kawasaki-shi (JP)

( * ) Notice: Subject to any disclaimer, the term of this patent is extended or adjusted under 35 U.S.C. 154(b) by 57 days.

(21) Appl. No.: 13/589,369

(22) Filed: Aug. 20, 2012

(65) Prior Publication Data

US 2013/0049864 A1 Feb. 28, 2013

(30) Foreign Application Priority Data

Aug. 29, 2011 (JP) ................. 2011-185608

(51) Int. Cl.
*H03F 3/45* (2006.01)

(52) U.S. Cl.
USPC .......................................... 330/259; 330/261

(58) Field of Classification Search
USPC ................. 330/259, 254, 257, 261, 260
See application file for complete search history.

(56) References Cited

U.S. PATENT DOCUMENTS

| | | | |
|---|---|---|---|
| 6,295,245 B1 | 9/2001 | Tomita et al. | |
| 6,518,841 B1 * | 2/2003 | Mariani et al. | 330/253 |
| 6,801,080 B1 * | 10/2004 | Arcus | 327/563 |
| 7,071,772 B2 * | 7/2006 | Cho | 327/563 |
| 7,924,067 B2 * | 4/2011 | Cowles et al. | 327/108 |

FOREIGN PATENT DOCUMENTS

JP  2000-156082 A  6/2000

* cited by examiner

*Primary Examiner* — Henry Choe
(74) *Attorney, Agent, or Firm* — Miles & Stockbridge P.C.

(57) ABSTRACT

An output signal characteristic of a differential amplifier circuit is improved. When an input data signal becomes 'Low', current flowing through a first transistor will decrease and potential at a connection (a node) between a first resistor and a second resistor will increase. This potential is input (negatively fed back) to the gate of a second transistor, and because this gate potential increases, a tail current amount is adjusted in an increasing direction. When the input data signal becomes 'High', the current of the first transistor increases and thus the potential at the node decreases. Thus, the gate potential (negative feedback) of the second transistor decreases, and the tail current amount is adjusted in a decreasing direction. Thus, in the rising and falling of an input waveform, the difference in a delay time with respect to the output waveform decreases, respectively.

22 Claims, 14 Drawing Sheets

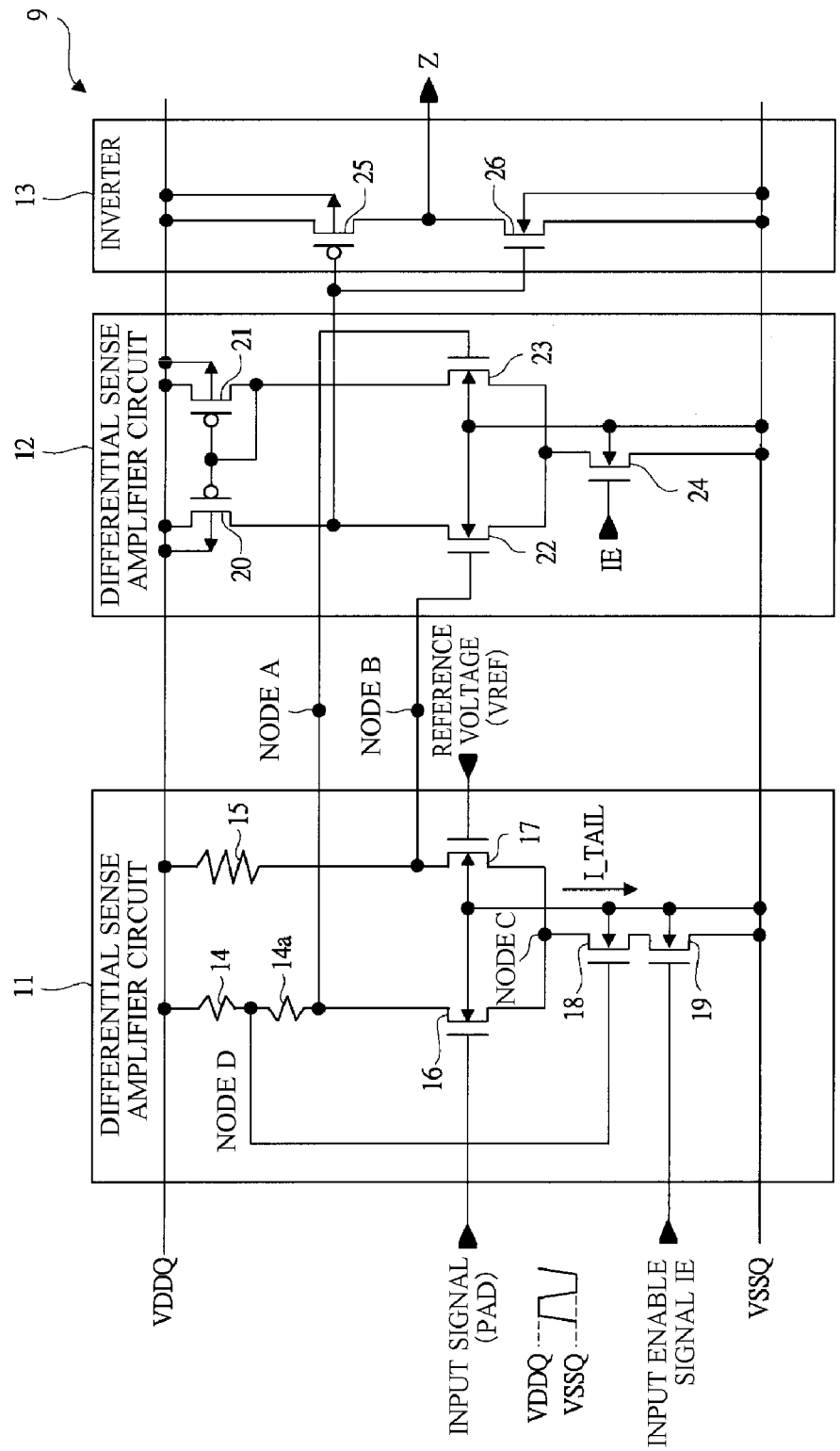

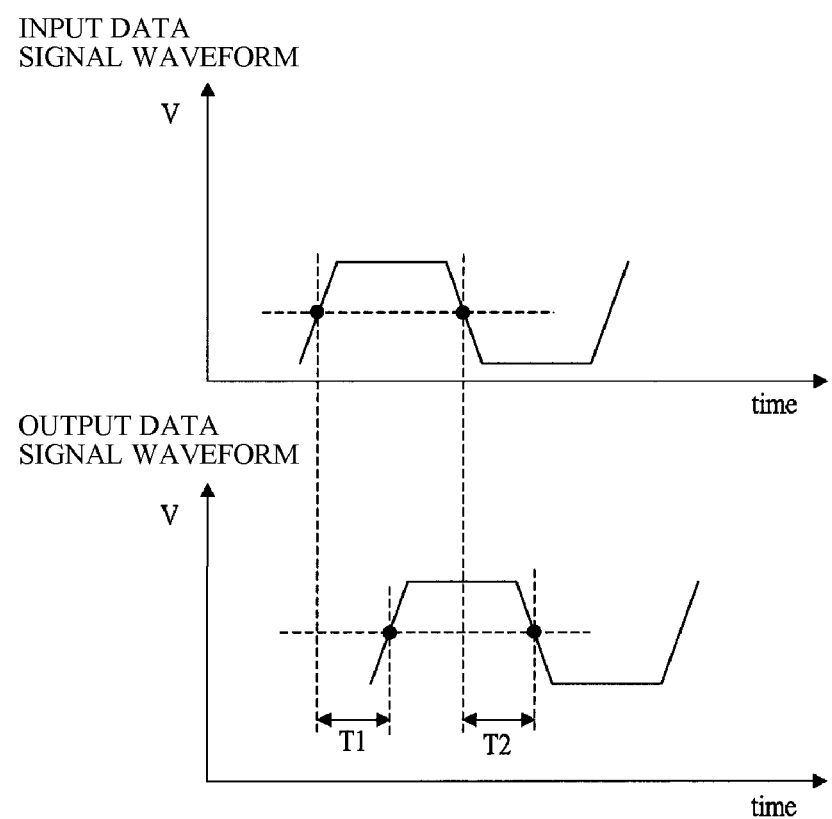

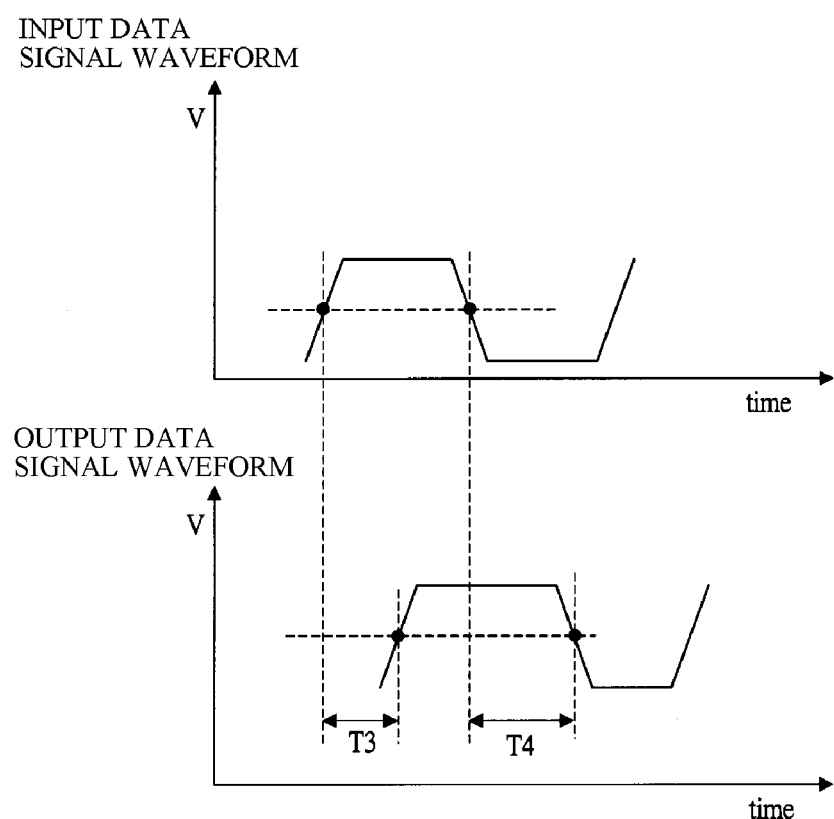

SEMICONDUCTOR INTEGRATED CIRCUIT DEVICE

CROSS-REFERENCE TO RELATED APPLICATION

The disclosure of Japanese Patent Application No 2011-185608 filed on Aug. 29, 2011 including the specification, drawings and abstract is incorporated herein by reference in its entirety.

BACKGROUND

The present invention relates to semiconductor integrated circuit devices, and more particularly relates to techniques effective in the interface circuit for coupling other semiconductor integrated circuit device.

When a semiconductor integrated circuit device, such as an SDRAM (Synchronous Dynamic Random Access Memory), is coupled to a semiconductor integrated circuit device, such as a microcomputer, an interface circuit is required inside the respective devices. This interface circuit is designed based on a specification complying with the international standard defined for each type of SDRAM.

In the SDRAM, the DDR (Double Data Rate) standard, the DDR2 standard, the DDR3 standard, the LPDDR (Low Power Double Data Rate) standard, the LPDDR2 standard, and the like have been established.

The DDR standard includes a DDR function to read and write data at both rising and falling of the clock signal, so that data is transferred at a speed of twice the internal clock frequency of an SDRAM.

In the DDR2 standard, because the clock frequency in outputting data to the outside is twice the internal clock frequency of an SDRAM, the data can be transferred four times the internal clock frequency. In the DDR3 standard, because the clock frequency in outputting data to the outside is four times the internal clock frequency of an SDRAM, the data can be transferred eight times the internal clock frequency.

Recently, while the data transfer rate of the SDRAM has been increased, reliable data transfer is also required. In an SRAM having the DDR function, because data is taken in at both the rising edge (the rising of a waveform) and the falling edge (the falling of a waveform) of a clock signal, not only timing margins between the rising edge of a clock signal and the rising edge and falling edge of data but timing margins between the falling edge of the clock signal and the rising edge and falling edge of the data need to be considered.

Furthermore, in the case of the LPDDR2 standard, the frequency of an external clock signal is up to 533 MHz (data transfer rate is 1066 Mbps), while in the case of the DDR3 SDRAM standard, the frequency of an external clock signal is specified up to 800 MHz (data transfer rate is 1600 Mbps). As the data transfer rate increases, the data transfer period decreases and therefore it is increasingly difficult to secure the timing margins.

SUMMARY

In the interface circuit with respect to the SDRAM having the DDR function, as described in Japanese Patent Laid-Open No. 2000-156082 (Patent Document 1), used is an input buffer circuit which includes a differential amplifier circuit receiving a single-ended input signal at one input terminal and receiving a reference voltage at other input terminal.

In this differential amplifier circuit, the characteristic of an output signal of the differential amplifier differs between when the voltage of an input signal is larger than a reference voltage (the input signal is at a 'High' level) and when it is smaller (the input signal at a 'Low' level). Specifically, in the differential amplifier circuit, there is a difference between a response time from the rising of an input signal waveform until an output signal waveform varies in response thereto, and a response time from the falling of the input signal waveform until the output signal waveform varies in response thereto.

A semiconductor integrated circuit device is coupled to an SDRAM by means of a plurality of signal lines for transferring data. Accordingly, in an interface circuit of the semiconductor integrated circuit device, an input buffer circuit is provided for each bus. In order to take in multi-bit data into the semiconductor integrated circuit device, a plurality of input buffer circuits preferably outputs output signals at substantially the same timing, respectively.

However, as stated above, if there is a difference in the response time between the rising and the falling of the input signal waveform in the differential amplifier circuit, the timing of the output signal will shift from each other among a plurality of input buffer circuits, resulting in a pin-to-pin skew. This causes a decrease in the timing margin.

The present invention has been made in view of the above circumstances and improves the characteristic of the output signal of a differential amplifier circuit.

The other purposes and the new features of the present invention will become clear from the description of this specification and the accompanying drawings.

The following explains briefly the outline of a typical invention among the inventions disclosed in the present application. A differential amplifier circuit including a first differential input section that receives an input signal from an external connection terminal and a second differential input section that receives a reference voltage detects a current generated in the first differential input section, and feeds this back to a tail current source to control a tail current.

The following explains briefly the effect acquired by the typical invention among the inventions disclosed in the present application. The characteristic of the output signal of a differential amplifier circuit can be improved.

BRIEF DESCRIPTION OF THE DRAWINGS

FIG. 4 is an explanatory view showing an example of an input buffer used in an I/O cell which the present inventor studied;

FIG. 6 is an explanatory view showing an example of an input waveform and an output waveform in the differential amplifier circuit of FIG. 4;

FIG. 9 is an explanatory view showing an example of the timings of an input waveform and an output waveform in the differential amplifier circuit of FIG. 7;

DETAILED DESCRIPTION

Hereinafter, embodiments of the present invention will be described in detail with reference to the accompanying drawings. In all the drawings for explaining the embodiments, the same symbol is attached to the same member, as a principle, and the repeated explanation thereof is omitted.

First Embodiment

Figure 1:
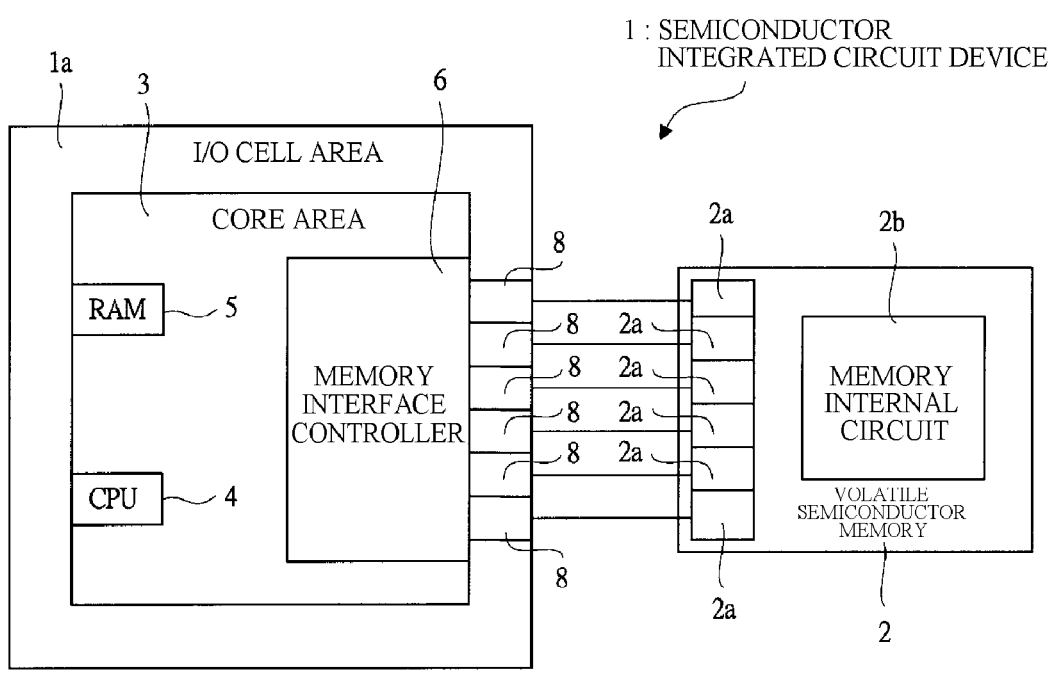
FIG. 1 is a block diagram showing an example of the configuration of a semiconductor integrated circuit device 1 and a semiconductor integrated circuit device 2 according to the First Embodiment of the present invention.
Figure 2:
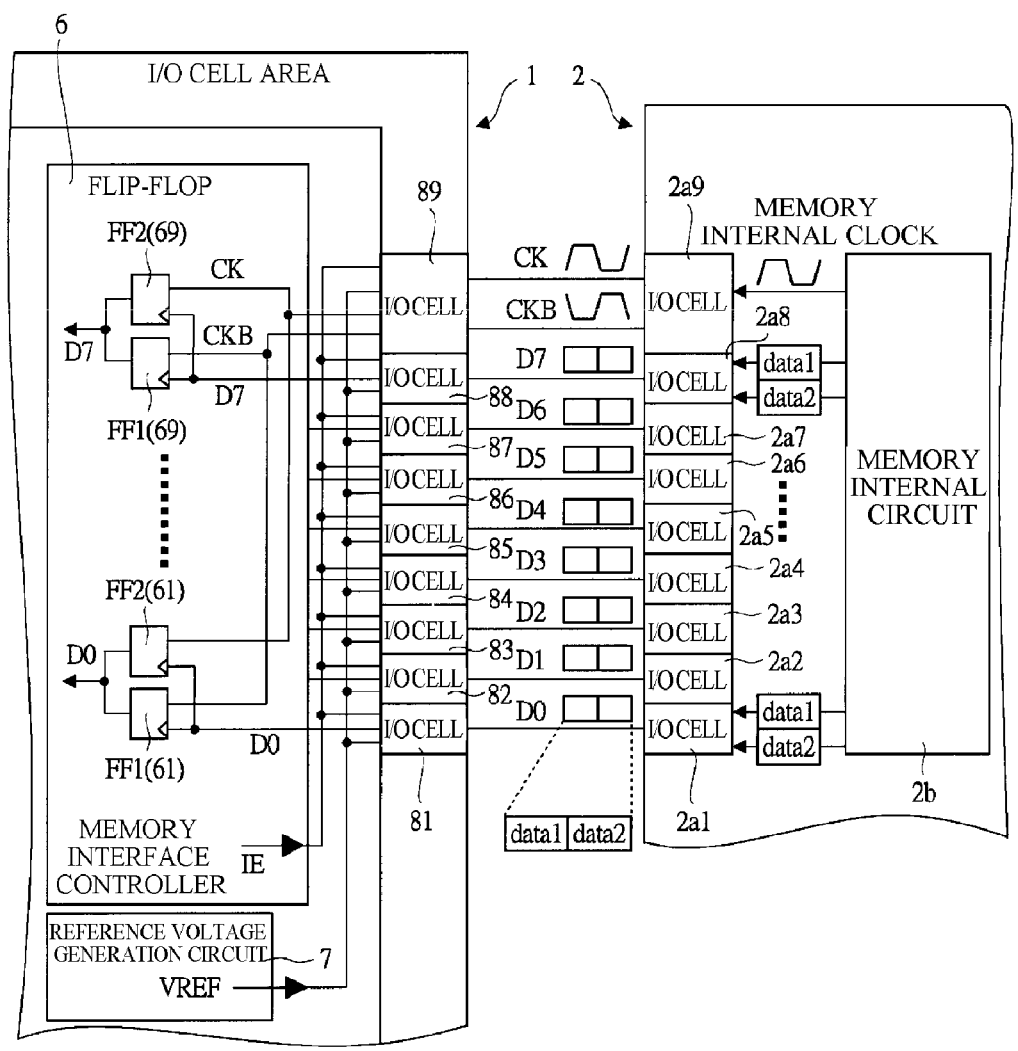
FIG. 2 is an explanatory view of a connection portion between the semiconductor integrated circuit device 1 and the semiconductor integrated circuit device 2 in FIG. 1.
Figure 3A:
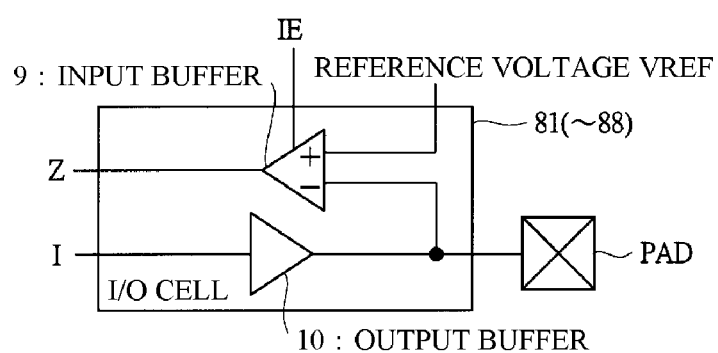
FIGS. 3A and 3B are explanatory views showing an example of the configuration in an I/O cell of FIG. 2.
Figure 3B:
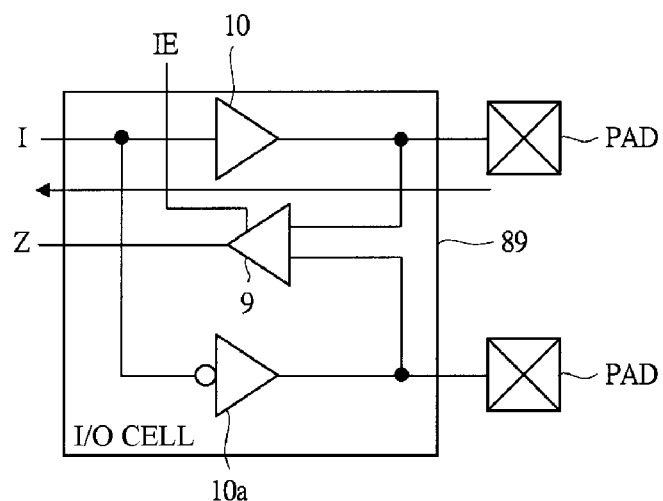
Figure 5A:
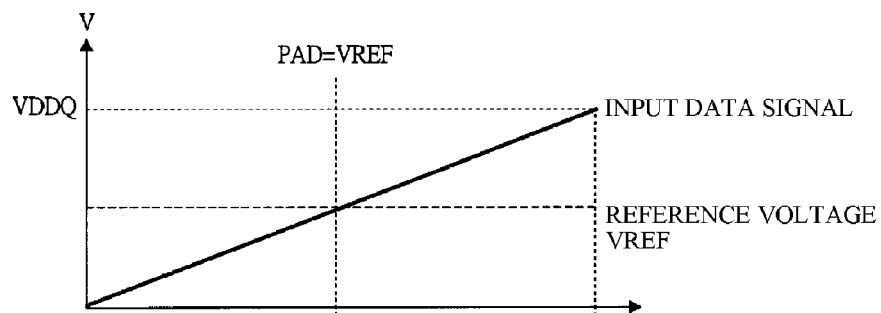
FIGS. 5A to 5C are explanatory views showing an example of a DC characteristic in a differential amplifier circuit of FIG. 4.
Figure 5B:
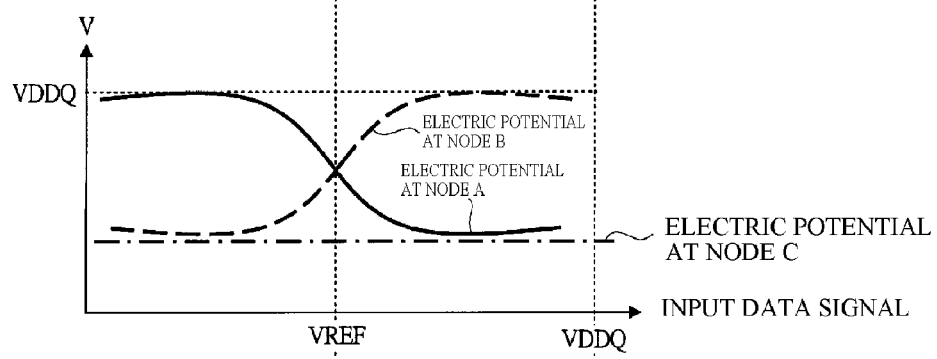
Figure 5C:
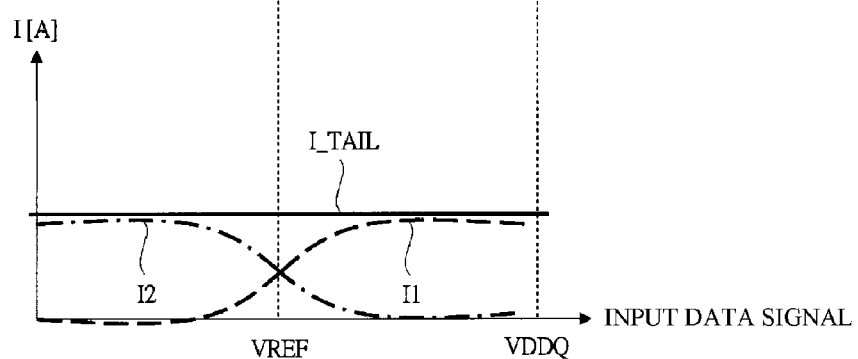
Figure 7:
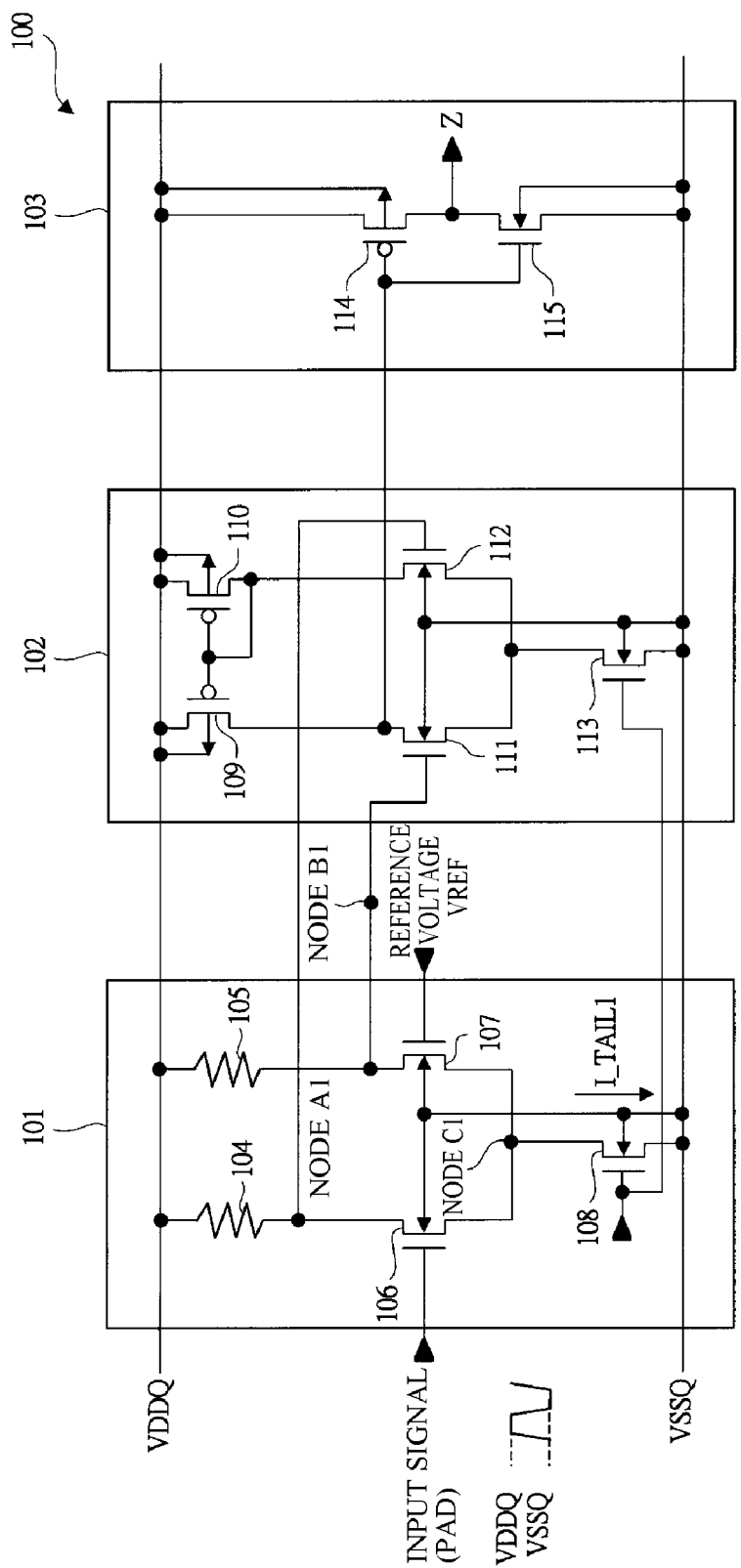
FIG. 7 is a conventional circuit diagram showing an example of the configuration in the input buffer of FIG. 3.
Figure 8A:
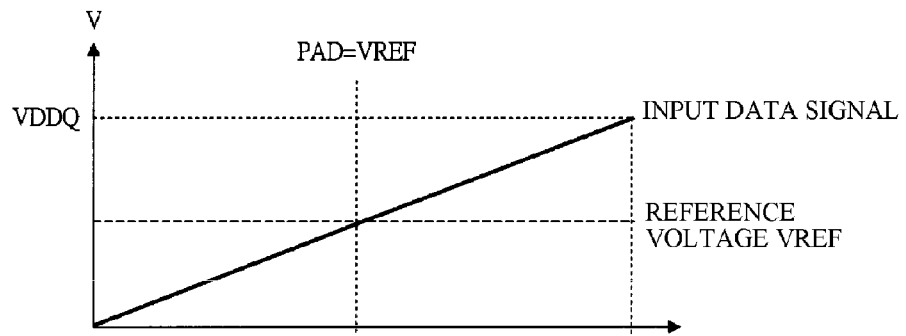
FIGS. 8A to 8C are explanatory views showing an example of a DC characteristic in a differential amplifier circuit of FIG. 7.
Figure 8B:
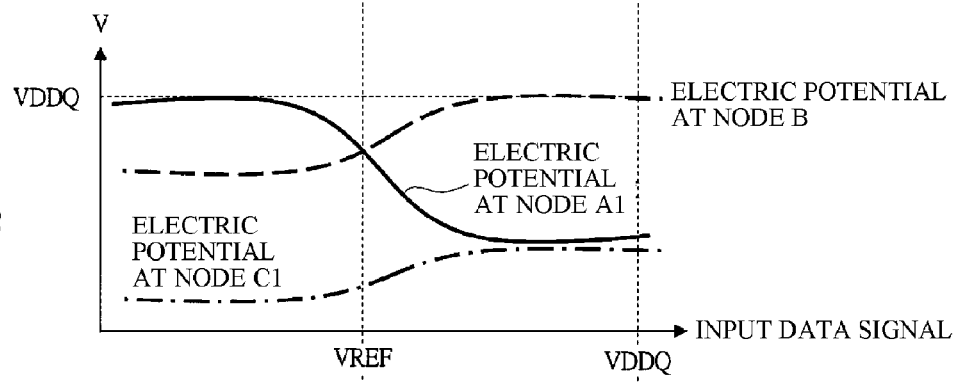
Figure 8C:
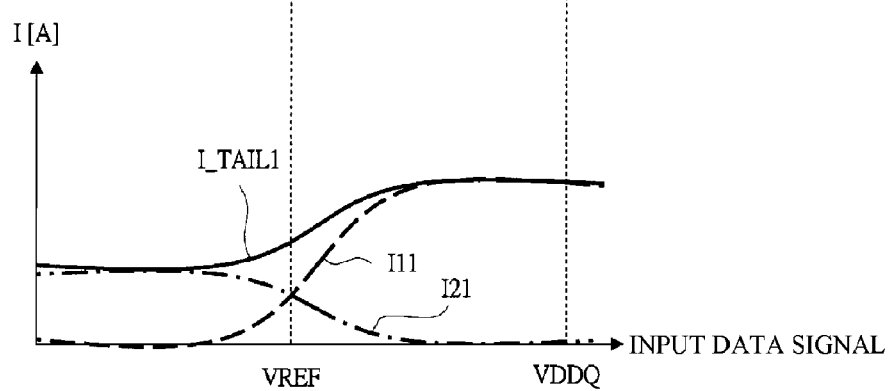

FIG. 1 is a block diagram showing an example of the configuration in which a semiconductor integrated circuit device 1 and a semiconductor integrated circuit device 2 according to the First Embodiment of the present invention are coupled to each other, FIG. 2 is an explanatory view of a connection portion between the semiconductor integrated circuit device 1 and the semiconductor integrated circuit device 2 in FIG. 1. FIGS. 3A and 3B are explanatory views showing an example of the configuration in an I/O cell of FIG. 2. FIG. 4 is an explanatory view showing an example of an input buffer used in an I/O cell which the present inventor studied. FIGS. 5A to 5C are explanatory views showing an example of a DC characteristic in a differential amplifier circuit of FIG. 4. FIG. 6 is an explanatory view showing an example of an input waveform and an output waveform in the differential amplifier circuit of FIG. 4. FIG. 7 is a circuit diagram showing an example of the configuration in the input buffer of FIG. 3A. FIGS. 8A to 8C are explanatory views showing an example of a DC characteristic in the differential amplifier circuit of FIG. 7. FIG. 9 is an explanatory view showing an example of the timings of an input waveform and an output waveform in the differential amplifier circuit of FIG. 7.

Hereinafter, the embodiments will be described in detail.

In the First Embodiment, to the semiconductor integrated circuit device 1 including a microcomputer and the like, as shown in FIG. 1, the semiconductor integrated circuit device 2 is coupled. The semiconductor integrated circuit device 2 is, for example, an SDRAM having the DDR function, such as DDR, DDR2, DDR3, or LPDDR2, or a nonvolatile memory, such as a flash memory, an MRAM (Magnetic Random Access Memory), and an FeRAM (Ferroelectric Random Access Memory) having the DDR function. Usually, the semiconductor integrated circuit device 1 and the semiconductor integrated circuit device 2 are mounted on a printed circuit board or the like in a separate package, respectively, and are coupled to each other, but it is also possible to couple these devices to each other in one package as a multi-chip module, for example.

An I/O area 1a is provided in four side sections of the semiconductor integrated circuit device 1, respectively. A core area 3 is formed in the semiconductor integrated circuit device 1 so as to be surrounded by the I/O area 1a. Note that FIG. 1 also shows a layout (arrangement) other than the configuration.

The core area 3 is constituted by including a plurality internal circuits, such as a CPU4, a RAM5, a memory interface controller 6, and a reference voltage generation circuit 7 (FIG. 2).

The CPU4 manages the main control in the semiconductor integrated circuit device 1. The RAM5 is a volatile semiconductor memory and is used for temporary storage of data.

Moreover, in the I/O area 1a, a plurality of I/O cells performing inputting/outputting of a signal with respect to the outside is provided, respectively. The I/O cells are each formed in a rectangular shape, for example, and are linearly arranged so that one short side thereof is parallel to one arbitrary side of a semiconductor chip.

The semiconductor integrated circuit device 1 includes an I/O cell portion 8 including a plurality of I/O cells to which the semiconductor integrated circuit device 2 is coupled. The I/O cell portion 8 is an interface circuit with respect to the semiconductor integrated circuit device 2, and is coupled to an I/O cell portion 2a including a plurality of I/O cells, the I/O cell portion 2a serving as an interface circuit provided in the semiconductor integrated circuit device 2, respectively. The memory interface controller 6 carries out an operation control of the I/O cell portion 8 under the control of the CPU4 and the like to be described later. The reference voltage generation circuit 7 is a circuit generating a reference voltage VREF supplied to the I/O cell portion 8.

FIG. 2 is an explanatory view in the connection portion between the semiconductor integrated circuit device 1 and the semiconductor integrated circuit device 2 in FIG. 1 when data read from the semiconductor integrated circuit device 2 is input to the semiconductor integrated circuit device 1. Although not shown here, when data output from the semiconductor integrated circuit device 1 is written to the semiconductor integrated circuit device 2, the relationship between transmission and reception is reversed.

In the semiconductor integrated circuit device 1, I/O cells 81-88, to which data signals DQ0-DQ7 are input and output, and an I/O cell 89, to which data strobe signals DQS and DQSB serving as clock signals used for data transfer are input and output, are provided. Similarly, in the semiconductor integrated circuit device 2, I/O cells 2a1-2a8, to which the data signals DQ0-DQ7 are input and output, and an I/O cell 2a9, to which the clock signals DQS and DQSB are input and output, are provided. A memory internal circuit 2b is coupled to the I/O cells 2a1-2a9.

An input enable signal IE output from the memory interface controller 6 is input to the I/O cells 81-89, respectively. The input enable signal IE is a control signal for causing an input buffer constituting the I/O cell to operate. Moreover, the reference voltage VREF which the reference voltage generation circuit 7 generates is supplied to the I/O cells 81-89.

Flip-flop portions 61-69 are provided in the memory interface controller 6. Note that, in the memory interface controller 6 of FIG. 2, while only a configuration example in which the memory interface controller 6 is coupled to the input buffer side of the I/O cells 81-89 is shown, a configuration in which the memory interface controller 6 is coupled to the output buffer side of the I/O cells 81-89 is omitted.

The flip-flop portions 61-69 are each constituted by two flip-flops FF1 and FF2. For example, in the case of the flip-flop portion 61 coupled to the I/O cell 81, an internal data signal DQI0 output from the I/O cell 81 is input to data terminals of the flip-flops FF1 and FF2, respectively.

Moreover, an internal clock signal DQSIB output from the I/O cell 89 is input to a clock input terminal of the flip-flop FF1, and an internal clock signal DQSI output from the I/O cell 89 is input to a clock input terminal of the flip-flop FF2. The internal clock signal DQSIB is an inverted signal of the internal clock signal DQSI. The output terminals of the flip-flops FF1 and FF2 are coupled in common to an output terminal DQL0 of the flip-flop portion, and data is output to the RAM5 or the like.

Hereinafter, the connection configuration between the flip-flop portions 62-69 and the I/O cells 82-89 is also the same as that in the case of the flip-flop portion 61 and the I/O cell 81 and therefore the description thereof is omitted.

Here, the operation during data read in FIG. 2 (data transfer from the semiconductor integrated circuit device 2 to the semiconductor integrated circuit device 1) is described.

During data read, data is output from the memory internal circuit 2b in synchronization with a memory internal clock. Here, the output data is transferred to the semiconductor integrated circuit device 1 using a DDR data transfer system, for example.

In this case, assume that a plurality of buses is provided in parallel from the memory internal circuit 2b to the I/O cells 2a1-2a8, and that one bus has one-bit data.

Two buses (corresponding to two bits) are combined into one, and data is transferred at a double frequency. The clock signal is also output together with data, but in the case of the DDR data transfer system, differential clock signals are transmitted from the I/O cell 2a8 to the semiconductor integrated circuit device 1 side.

Here, the differential clock signals are the clock signals DQS and DQSB. In the case of DDR, the frequency of the clock signals DQS and DQSB is the same as that of the memory internal clock (in the case of DDR2 it is the double frequency, and in the case of DDR3 it is the quadruple frequency).

The differential clock signals DQS and DQSB and the data signals DQ0-DQ7 are taken into the semiconductor integrated circuit device 1 via the I/O cells 81-89 of the semiconductor integrated circuit device 1.

As described above, the reference voltage VREF which the reference voltage generation circuit 7 generates is supplied the respective I/O cells 81-89, and an input signal is taken into the respective I/O cells 81-89 with reference to the reference voltage VREF.

The internal clock signals DQSI and DQSIB of the semiconductor integrated circuit device 1 output from the I/O cell 89 are input to the respective flip-flops FF1 and FF2 in the flip-flop portions 61-69 of the memory interface controller 6.

In the internal input data signals DQI0-DQI7 of the semiconductor integrated circuit device 1, data is taken in in synchronization with the rising timing of the internal clock signals DQSI and DQSIB by the flip-flops FF1 and FF2 of the flip-flop portions 61-69. With this operation, data can be read for every half period of the clock signals DQS and DQSB.

FIGS. 3A and 3B are explanatory views showing an example of the configuration in the I/O cell 81(-89) of FIG. 2.

The I/O cell 81(-89) is constituted by an input buffer 9 and an output buffer 10 as shown in the view. An input section of the input buffer 9 and an output section of the output buffer 10 are coupled in common to a pad PAD coupled to an I/O terminal that is an external connection terminal of the semiconductor integrated circuit device 1.

As shown in FIG. 3A, in the I/O cell 81(-88) for a data signal, the reference voltage VREF, which the reference voltage generation circuit 7 generates, and the input enable signal IE are input to the input buffer 9. Then, the memory interface controller 6 is coupled to the output section of the input buffer 9 and the input section of the output buffer 10, respectively.

Moreover, as shown in FIG. 3B, the I/O cell 89 for the clock signal is constituted by the input buffer 9 and output buffers 10 and 10a, and differential clock signals are input to the input buffer 9. The configuration differs between the I/O cell for a data signal and the I/O cell for the clock signal, in that the input buffer of the I/O cell for a data signal amplifies a difference between the reference voltage VREF and an input signal while the input buffer of the I/O cell for the clock signal amplifies a difference between the differential signals.

Figure 14:
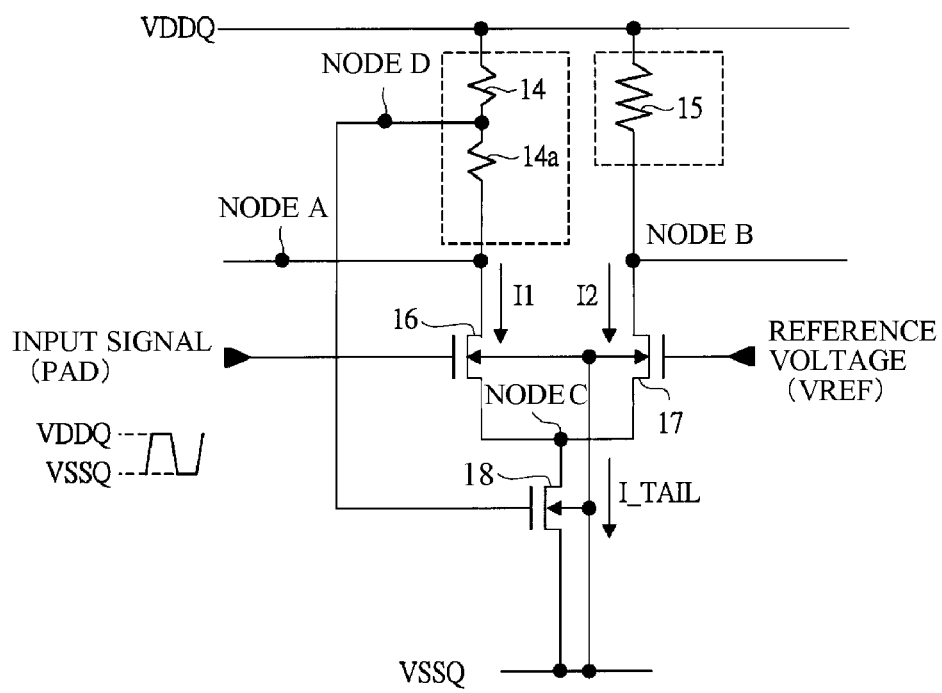
FIG. 14 is an explanatory view showing a basic configuration of a differential amplifier circuit according to the First Embodiment of the present invention.

FIG. 14 is a circuit configuration diagram showing an example of a differential amplifier circuit according to the embodiment. A differential signal input section is configured such that an input signal is input to the gate of a transistor 16 which is a first differential input section and the reference voltage is input to the gate of a transistor 17 which is a second differential amplifier section. The source terminal of the transistor 16 and the source terminal of the transistor 17 are coupled to the drain terminal of a transistor 18 serving as a tail current source, and a current from the transistor 16 and a current from the transistor 17 flow to a power supply voltage VSSQ via the transistor 18. When an input signal having a voltage amplitude between a power supply voltage VDDQ and the power supply voltage VSSQ is input, the operation point voltage of the differential amplifier circuit will vary in response to the voltage of the input signal and the characteristic will vary. In order to moderate a change in the characteristic, the gate voltage of the transistor 18 is controlled in response to the input signal, thereby controlling the tail current.

FIG. 4 is an explanatory view showing an example of the input buffer 9 used in an I/O cell which the present inventor studied.

The input buffer 9 includes two differential amplifier circuits 11 and 12 and an inverter 13. Although two differential amplifier circuits are used in this example, the input buffer 9 may be constituted by one, or three or more differential amplifier circuits in accordance with a required gain.

The differential amplifier circuit 11 is a circuit, to which a function to use the differential amplifier circuit shown in FIG. 14 in the input buffer is added. The differential amplifier circuit 11 is constituted by resistors 14, 14a and 15 used as a load element, transistors 16 and 17 used as an input transistor, a transistor 18 used as the tail transistor serving as a tail current source, and in addition a transistor 19 for carrying out an input operation control. The differential amplifier circuit 12 is constituted by transistors 20-24. Moreover, the inverter 13 is constituted by transistors 25 and 26.

The transistors 20, 21 and 25 are each constituted by a P-channel MOS (Metal Oxide Semiconductor) transistor, and the transistors 16-19, 22-24 and 26 are each constituted by an N-channel MOS transistor.

The power supply voltage VDDQ is coupled to one connection of the respective resistors 14 and 15, one connection of the transistor 20, one connection of the transistor 21, one connection of the transistor 25, and a backgate of the respective transistors 20, 21 and 25, respectively.

One connection of the resistor 14a is coupled to the other connection of the resistor 14. One connection of the transistor 16 and the gate of the transistor 23 are coupled to the other connection of the resistor 14a, respectively. One connection of the transistor 17 and the gate of the transistor 22 are coupled to the other connection of the resistor 15, respectively.

The gate of the transistor 16 is one input terminal of the differential amplifier circuit 11, and a signal output from the semiconductor integrated circuit device 2 is input to this gate, and the gate of the transistor 17 is other input terminal of the differential amplifier circuit 11, and the reference voltage VREF which the reference voltage generation circuit 7 generates is input to this gate.

One connection of the transistor 18 is coupled to the other connection of the transistor 16 and the other connection of the transistor 17, and the other connection of the transistor 19 is coupled to the other connection of the transistor 18.

A connection (node D) between the resistor 14 and the resistor 14a is coupled to the gate of the transistor 18, and one connection of the transistor 19 is coupled to the other connection of the transistor 18.

Moreover, the input enable signal IE output from the memory interface controller 6 is input to the gate of the transistor 19. The reference potential VSSQ is coupled to the other connection of the transistor 19 and the backgate of the respective transistors 16, 17, 18 and 19, respectively.

One connection of the transistor 22, the gate of the transistor 25, and the gate of the transistor 26 are coupled to the other connection of the transistor 20, respectively. The gate of the transistor 21, the other connection of the transistor 21, and one connection of the transistor 23 are coupled to the gate of the transistor 20, respectively.

The other connection of the transistor 23 and one connection of the transistor 24 are coupled to the other connection of the transistor 22, respectively.

The input enable signal IE is coupled to the gate of the transistor 24. Moreover, the reference potential VSSQ is coupled to the other connection of the transistor 24, the backgate of the transistor 24, and the backgate of the respective transistors 22 and 23, respectively.

Furthermore, one connection of the transistor 26 is coupled to the other connection of the transistor 25, and this connection serves as the output section of the input buffer 9. The reference potential VSSQ is coupled to the other connection and the backgate of the transistor 26, respectively.

As shown in FIG. 4, the input buffer 9 is specified to receive a signal by means of the differential amplifier circuit using the reference power supply VREF. In the first stage differential amplifier circuit 11, the reference voltage VREF is coupled to the gate of the transistor 17, and a signal is input to the gate of the other transistor 16.

In the case of this example, because a gain cannot be secured in the first stage differential amplifier circuit 11, the second stage differential amplifier circuit 12 is provided for securing a necessary gain. The differential amplifier circuit 12 is of a current mirror type, and amplifies so that the amplitude of a signal sent to the inverter 13 in the subsequent stage can be obtained sufficiently.

The signal amplified by the differential amplifier circuit 12 is inverted by the inverter 13, and output as an output signal having a voltage amplitude of the power supply voltage VDDQ minus the reference potential VSSQ of the input buffer 9.

Next, the operation of the differential amplifier circuit 11 provided in the input buffer 9 according to the embodiment is described.

In the differential amplifier circuit 11 of the input buffer 9, as shown in the view, a signal is negatively fed back to the gate of the transistor 18 used as the tail transistor serving as the tail current source.

First, the input enable signal IE is input to the gate of the transistor 19, so that the input buffer 9 becomes in an operable state. Then, when the input data signal becomes 'Low', a current I1 (a source-drain current IDS) flowing through the transistor 16 will decrease and the potential at the connection (node D) between the resistor 14 and the resistor 14a will increase. Because this potential is input (negatively fed back) to the gate of the transistor 18, the gate potential of the transistor 18 increases and thereby a tail current amount I_TAIL is adjusted in an increasing direction.

Next, when the input data signal becomes 'High', the current I1 will flow more and therefore the potential at the node D will decrease. Thus, the gate potential (negative feedback) of the transistor 18 decreases, so that the tail current amount I_TAIL is adjusted in a decreasing direction.

FIGS. 5A to 5C are explanatory views showing an example of the DC characteristic when the input voltage is varied in the differential amplifier circuit 11.

FIG. 5A shows the characteristic of the input data signal (indicated by a solid line) and the reference voltage VREF (indicated by a dotted line) input to the differential amplifier circuit 11. FIG. 5B shows the characteristics of the potential (indicated by a solid line) at a connection (a node A in FIG. 4) between the resistor 14a and the transistor 16, the potential (indicated by a dotted line) at a connection (a node B of FIG. 4) between the resistor 15 and the transistor 17, and the potential (indicated by a dashed-dotted line) at a connection (a node C) between the transistors 16, 17 and 18. FIG. 5C shows the characteristics of the tail current I_TAIL (indicated by a solid line) flowing through the transistor 18, the current I1 (indicated by a dotted line) flowing through the transistor 16, and a current I2 (indicated by a dashed-dotted line) flowing through the transistor 17.

In FIG. 5A, the input data signal (solid line) input to the differential amplifier circuit 11 transitions in terms of DC voltage from 0 V (the reference potential VSSQ) to the power supply voltage VDDQ. In contrast, the power supply voltage VREF (dotted line) is maintained always at a substantially constant voltage value.

Each voltage at the nodes A to C at this time has a waveform shown in FIG. 5B, and each current of the currents I1, I2, and I_TAIL has a waveform shown in FIG. 5C.

As described above, in the differential amplifier circuit 11, when the input data signal is 'Low', the current amount of the current I1 decreases and the potential at the node D (FIG. 4) increases, and as a result the gate potential of the transistor 18 increases and the current amount of I_TAIL increases.

Moreover, when the input data signal becomes 'High', the current I1 flows more and therefore the potential at the node D decreases and as a result the gate potential of the transistor 18 decreases and accordingly the tail current amount I_TAIL decreases.

Thus, as shown in FIGS. 5A to 5C, in the differential amplifier circuit 11, either when the input data signal is 'Low' (when the input data signal has a voltage lower than the reference voltage VREF) or when the input data signal is 'High' (when the input data signal has a voltage higher than the reference voltage VREF), a variation in the voltage at the node C shown in FIG. 5B and a variation in the tail current I_TAIL shown in FIG. 5C can be reduced.

In this manner, if a variation in the voltage at the node C and a variation in the tail current I_TAIL decrease by causing the transistor 18 to operate in a negative feedback mode, then as shown in FIG. 6, a delay difference between a delay T1 from the rising of the waveform of the input data signal input to the differential amplifier circuit 11 to the rising of the output signal waveform and a delay T2 from the falling of the input data signal waveform to the falling of the output signal waveform decreases, and an effect of reducing the skew of the signal input to the flip-flop can be obtained.

As a comparative example, FIG. 7 shows an example of the configuration according to a conventional circuit in the input buffer 9 of FIGS. 3A and 3B.

An input buffer 100 includes differential amplifier circuits 101 and 102 and an inverter 103, as shown in the view. The differential amplifier circuit 101 is constituted by resistors 104 and 105 and transistors 106-108, and the differential amplifier circuit 102 is constituted by transistors 109-113.

Moreover, the inverter 103 includes transistors 114 and 115. The transistors 106-108, 111-113 and 115 are each constituted by an N-channel MOS transistor, and the transistors 109, 110 and 114 are each constituted by P-channel MOS transistor.

The power supply voltage VDDQ is coupled to one connection of the respective resistors 104 and 105, one connection of the respective transistors 109 and 110, one connection of the transistor 114, and the backgate of the respective transistors 109, 110 and 114, respectively.

One connection of the transistor 106 and the gate of the transistor 112 are coupled to the other connection of the resistor 104, respectively. One connection of the transistor 107 and the gate of the transistor 111 are coupled to the other connection of the resistor 105, respectively.

A signal output from the semiconductor integrated circuit device 2 is input to the gate of the transistor 106, and the reference voltage VREF is input to the gate of the transistor 107.

One connection of the transistor 108 is coupled to the other connection of the transistor 106 and the other connection of the transistor 107, and a constant voltage is input to the gate of the transistor 108. Moreover, the reference potential VSSQ is coupled to the other connection of the transistor 108 and the backgate of the respective transistors 106-108, respectively.

One connection of the transistor 111 and the gates of the transistors 114 and 115 are coupled to the other connection of the transistor 109, respectively. The gate of the transistor 110, the other connection of the transistor 110, and one connection of the transistor 112 are coupled to the gate of the transistor 109, respectively.

One connection of the transistor 113 is coupled to the other connection of the respective transistors 111 and 112, and a constant voltage is input to the gate of the transistor 113. Moreover, the reference potential VSSQ is coupled to the other connection and the backgate of the transistor 113 and the backgate of the respective transistors 111 and 112, respectively.

One connection of the transistor 115 is coupled to the other connection of the transistor 114, and this connection serves as the output section of the input buffet 100. Moreover, the reference potential VSSQ is coupled to the other connection and the backgate of the transistor 115, respectively.

In the case of the configuration of the input buffer 100 of FIG. 7, the first-stage differential amplifier circuit 101 has a problem that the operation becomes unbalanced between during the rising of the input data signal waveform and during the falling of the input data signal waveform.

FIGS. 8A to 8C are explanatory views showing an example of DC characteristic in the differential amplifier circuit of FIG. 7, respectively. FIG. 9 is an explanatory view showing an example of the timings of the input data signal waveform and the output signal waveform in the differential amplifier circuit 101.

A solid line in FIG. 8A shows the input data signal, and transitions from the reference potential VSSQ to the power supply voltage VDDQ in terms of DC voltage. In contrast, the reference voltage VREF indicated by a dotted line is always maintained at a substantially constant voltage value.

The voltages at the nodes A1-C1 at this time correspond to the voltage waveforms shown in FIG. 8B, and the currents I11, I21, and I_TAIL1 correspond to the current waveforms shown in FIG. 8C. Here, the node A1 is the connection between the resistor 104 and the transistor 106, the node B1 is the connection between the resistor 105 and the transistor 107, and the node C1 is the connection between the transistors 106-108.

Moreover, the current I11 is a current flowing through the transistor 106, the current I21 is a current flowing through the transistor 107, and the current I_TAIL1 is a tail current flowing through the transistor 108.

When the input data signal is a "Low" signal, because the transistor 106 is turned off, the potential at the node A rises to the power supply voltage VDDQ and the potential at the node B on the opposite side is pulled to the reference potential VSSQ side.

Moreover, when the input data signal becomes a "High" signal, the transistor 116 on the input side comes into an ON state, and for example, when the potential of the input data signal becomes equal to or greater than 0.6 V, the current flowing through the transistor 106 on the input side becomes larger and thus the potential at the node A1 is pulled to the reference potential VSSQ side and the potential at the node B1 is pulled to the power supply voltage VDDQ side.

However, as shown in FIG. 8C, the reference voltage VREF is substantially constant, and therefore when the potential of the input data signal becomes a "High" signal, the current amount as a whole increases, while when the input data signal is a "Low" signal, the current amount decreases.

Therefore, the voltage at the node C (the node C is the drain of the transistor 108 that is the tail transistor) and the tail current will dramatically vary between 'High' and 'Low' of the input data signal. Thus, as shown in FIG. 9 the difference between a delay T3 from the rising of the input data signal waveform to the rising of the output signal waveform and a delay T4 from the falling of the input data signal waveform to the falling of the output signal waveform will increase. Because whether the input data signal is 'High' or 'Low' differs for every pin, this causes an increase in the pin-to-pin skew of the signal input to the flip-flop.

On the other hand, in the differential amplifier circuit 11 shown in FIG. 4, by introducing the negative feedback operation into the transistor 18 serving as the tail transistor, the voltage variation at the node C decreases and the difference between the delay T1 (FIG. 6) and the delay T2 (FIG. 6) can be reduced, and therefore the skew is reduced and the timing margin between the clock signal and the data signal input to the flip-flop will be improved.

Thus, according to the First Embodiment, the signal skew due to the input buffer can be significantly reduced and the failure and the like in reading data can be reduced.

Moreover, because a failure of the semiconductor integrated circuit device 1 associated with a reduction in the timing margin due to the skew can be reduced, the reliability of the semiconductor integrated circuit device 1 can be improved while increasing the yield.

Furthermore, in the First Embodiment, the input buffer provided in the I/O cells 81-88 provided in the semiconductor integrated circuit device 1 has been described, but the input buffer provided in the I/O cells 2a1-2a8 of the semiconductor integrated circuit device 2 may also have the same configurations as those of FIGS. 3A and 3B and FIG. 4.

Variation of the First Embodiment

In the First Embodiment described above, in the differential amplifier circuit 11 of the input buffer 9 (FIG. 4), the current on the input side is detected using the resistors 14 and 14a, but a technique is now described, in which the detection of the current on the input side is made by means other than the resistors.

Figure 10:
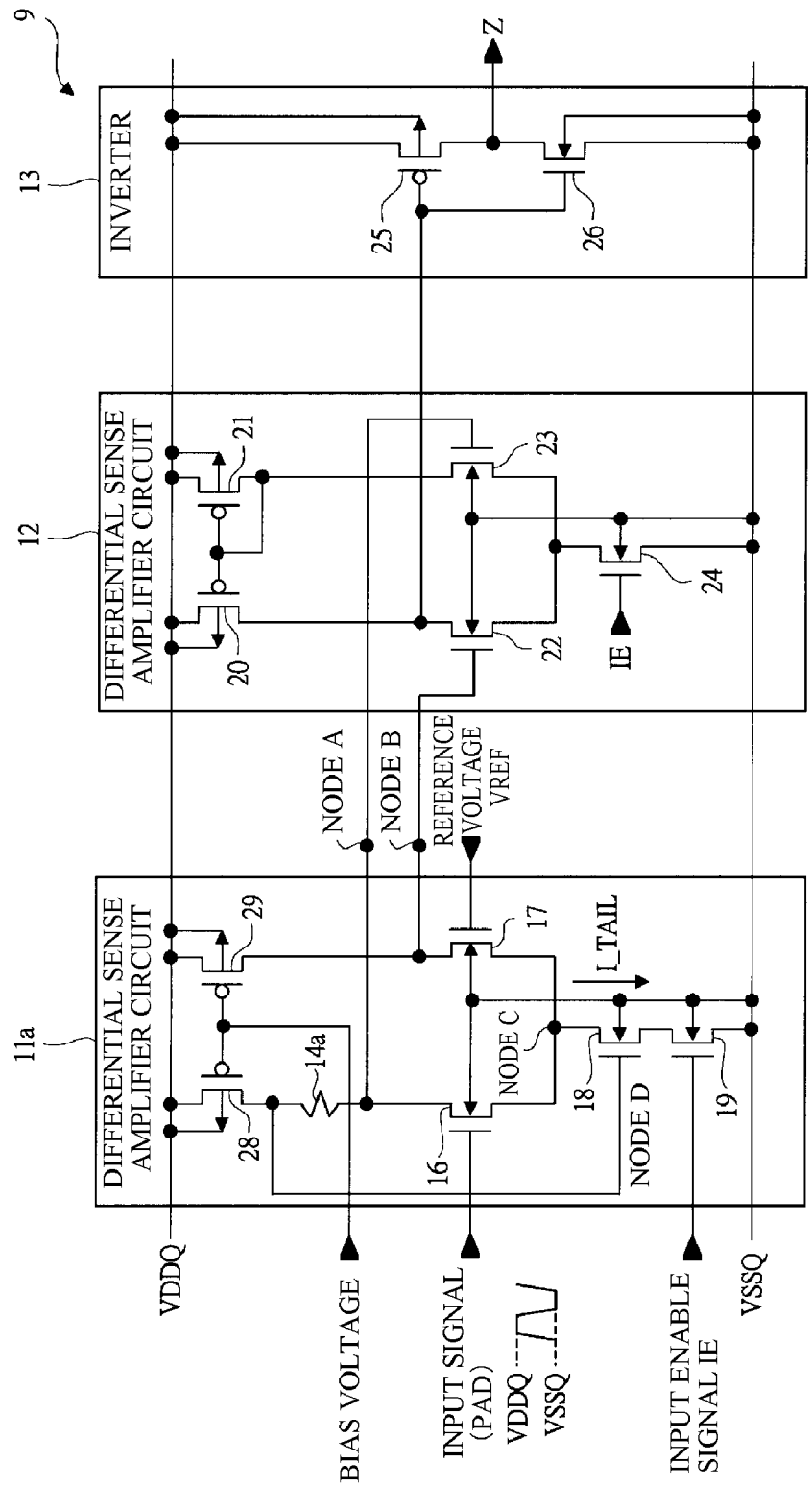
FIG. 10 is an explanatory view showing an example of an input buffer according to the Second Embodiment of the present invention.

FIG. 10 is an explanatory view showing an example of an input buffer according to variation of the First Embodiment of the present invention.

The input buffer 9 includes differential amplifier circuits 11a and 12 and the inverter 13.

The differential amplifier circuit 11a is constituted by the resistor 14a and the transistors 16-19, 28 and 29. The transistors 28 and 29 are each constituted by a P-channel MOS transistor.

The power supply voltage VDDQ is coupled to one connection of the transistor 28, one connection of the transistor 29, and the backgate of the respective transistors 28 and 29, respectively. Moreover, a bias voltage is supplied to the gates of transistors 28 and 29, respectively. Then, the values of currents flowing through the transistors 28 and 29 are adjusted with the bias voltage supplied to the transistors 28 and 29.

One connection Of the resistor 14a and the gate of the transistor 18 are coupled to the other connection of the transistor 28, respectively, and one connection of the transistor 17 is coupled to the other connection of the transistor 29.

Other than this, the connection configurations of the transistors 16-19 in the differential amplifier circuit 11a, the differential amplifier circuit 12, and the inverter 13 are the same as those of FIG. 4 of the First Embodiment described above, and therefore the description thereof is omitted.

In this manner, in the differential amplifier circuit 11a of FIG. 10, the resistor 14 is replaced with the P-channel MOS transistor 28 and the resistor 15 is replaced with the P-channel MOS transistor 29. Note that the operation is the same as that of FIG. 4 of the First Embodiment described above, and therefore the description thereof is omitted.

Thus, also in the variation of the First Embodiment, the signal skew due to the input buffer can be significantly reduced and the failure and the like in reading data can be reduced. Moreover, because the failure of the semiconductor integrated circuit device 1 can be reduced, an increase in the yield and an improvement in the reliability can be realized.

Furthermore, also in the variation of the First Embodiment, the input buffer provided in the I/O cells 2a1-2a8 of the semiconductor integrated circuit device 2 may also have the same configurations as those of FIG. 10.

Second Embodiment

Figure 11:
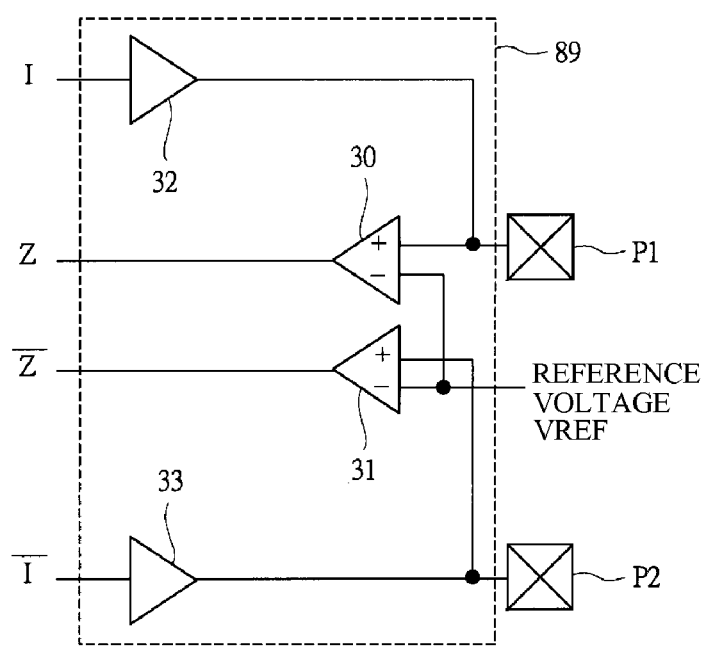
FIG. 11 is an explanatory view showing an example of the configuration of an I/O cell to which a clock signal is input, according to the Third Embodiment of the present invention.

FIG. 11 is an explanatory view showing an example of the configuration of an I/O cell, to which differential signals are input, according to the Second Embodiment of the present invention.

Outline of the Second Embodiment

According to the outline of the Second Embodiment of the present invention, a semiconductor integrated circuit device includes an I/O circuit (I/O cell 89) constituted by:
a first input buffer (input buffer 30) to which one of differential signals is input and a second input buffer (input buffer 31) to which the other one of the differential signals is input; and a first output buffer (output buffer 32) to which one of the differential signals is input and a second output buffer (output buffer 33) to which the other one of the differential signals is input. The first input buffer includes a first differential amplifier circuit amplifying and outputting a first signal (clock signal DQS) of the differential signals. The second input buffer includes a second differential amplifier circuit amplifying and outputting a second signal (clock signal DQSB) that is an inverted signal of the first signal of the differential signals.

Hereinafter, based on the above-described outline, the embodiment is described in detail.

In the Second Embodiment, an I/O cell whose input and output signals are differential is described. The examples of the I/O cell whose input and output signals are differential include the I/O cell 89 (FIG. 2) to which the clock signals DQS and DQSB output from the semiconductor integrated circuit device 2 (FIG. 2) are input.

FIG. 11 is a block diagram showing an example of the configuration of the I/O cell 89.

Differential input signals are input to the I/O cell 89 as the input signals, and the I/O cell 89 includes the input buffers 30 and 31 and the output buffers 32 and 33 as shown in the view.

The input section of the input buffer 30 and the output section of the output buffer 32 are coupled in common to a pad P1 coupled to the I/O terminal that is an external connection terminal of the semiconductor integrated circuit device 1. Moreover, the input section of the input buffer 31 and the output section of the output buffer 33 are coupled in common to a pad P2 coupled to an I/O terminal that is an external connection terminal of the semiconductor integrated circuit device 1.

The clock signal DQS is input to the input buffer 30 via the pad P1, and the clock signal DQSB that is an inverted signal of the clock signal DQS is input to the input buffer 31 via the pad P2.

Moreover, the input buffers 30 and 31 have a connection configuration similar to that of the input buffer used in the I/O cells 81-88. Here, because the connection configuration is the same as that of the input buffer 9 in FIG. 4 of the First Embodiment described above or the input buffer 9 in FIG. 10, the description thereof is omitted. The connection configuration differs from that of the input buffer 9 of FIG. 4 only in that in the input buffer 30 the clock signal DQS is input to the gate of the transistor 16 and that in the input buffer 31 the clock signal DQSB is input to the gate of the transistor 16.

In the case of a typical input buffer to which differential signals are input, for example, in FIG. 7, the clock signal DQS is input to the gate of the transistor 106, and the clock signal DQSB is input to the gate of the transistor 107.

On the other hand, in the I/O cell 89, as with the input buffer 9 of the I/O cells 81-88, in the differential amplifier circuit 11 that is provided in two input buffers 30 and 31, respectively, the clock signals DQS and DQSB are sensed with reference to the reference voltage VREF. Thereby, a delay between the data signal output from the input buffer 9 and the clock signals DQS and DQSB output from the input buffers 30 and 31 of the I/O cell 89 can be minimized.

Thus, in the Third Embodiment, a skew between the clock signals DQS and DQSB that are differential signals and the input data signal that is a single-ended signal can be reduced. Note that, in the case of a typical input buffer (differential amplifier circuit) to which differential signals are input, for example, in FIG. 7, the clock signal DQS is input to the gate of the transistor 106, and the clock signal DQSB is input to the gate of the transistor 107. Even if this typical input buffer is used for differential signals and the input buffer of the First Embodiment is used for a single-ended signal, the skew can be reduced although not as good as in the Second Embodiment.

Moreover, in the Second Embodiment, while the input buffer provided in the I/O cell 89 provided in the semiconductor integrated circuit device 1 has been described, the input buffer provided in the I/O cell 2a9 of the semiconductor integrated circuit device 2 may also have the same configuration as that of FIG. 4.

Third Embodiment

Figure 12:
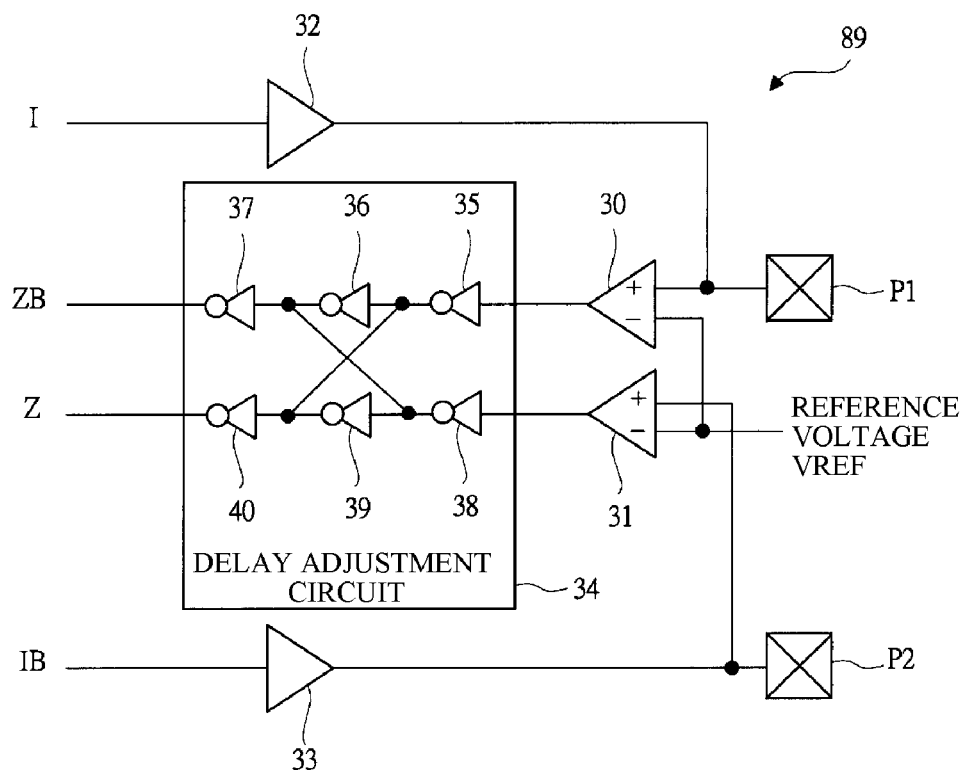
FIG. 12 is an explanatory view showing an example of the configuration of an I/O cell to which a clock signal is input, according to the Fourth Embodiment of the present invention.
Figure 13:
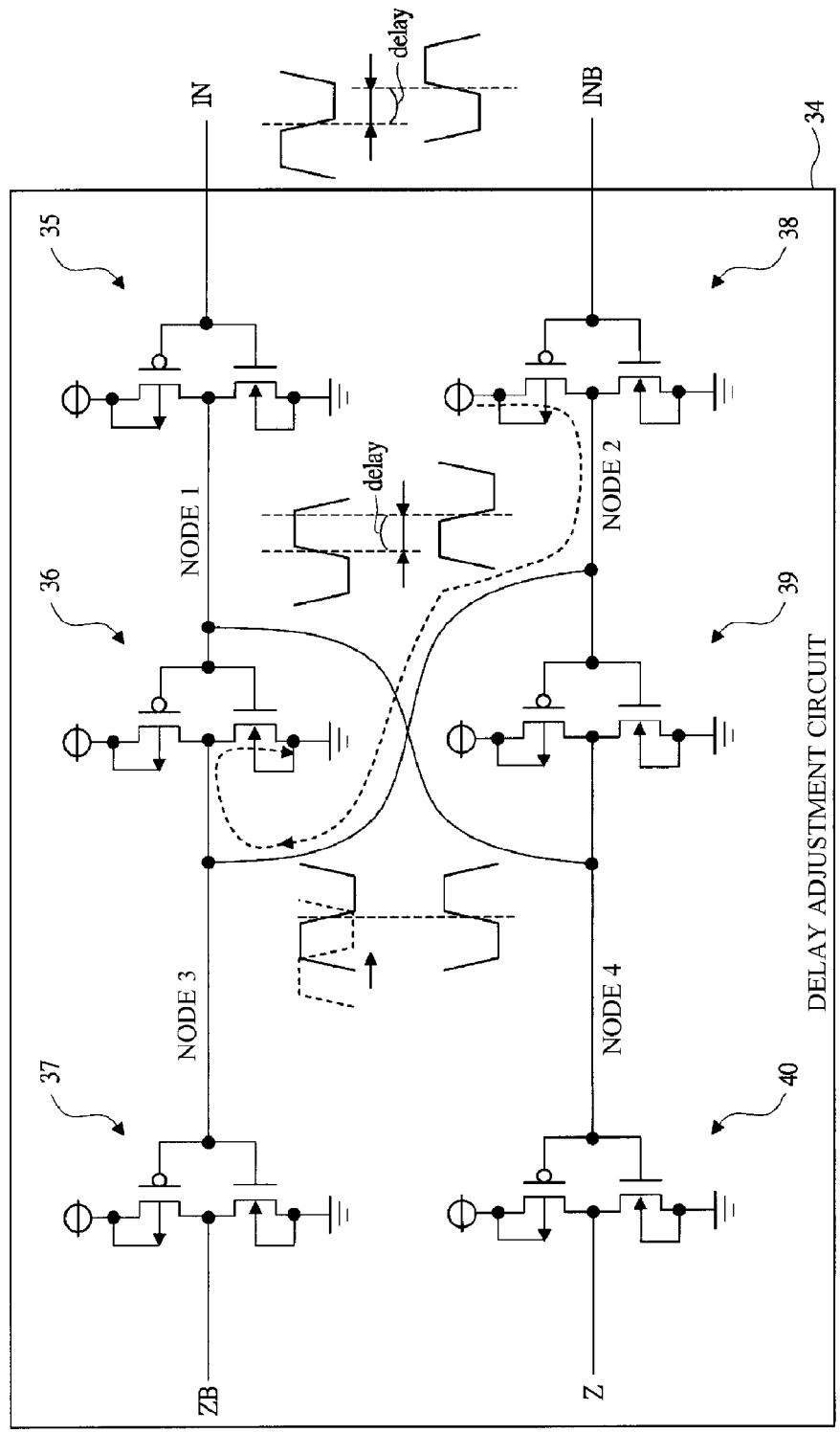
FIG. 13 is an explanatory view showing an operation example of a delay adjustment circuit provided in the I/O cell of FIG. 12.

FIG. 12 is an explanatory view showing an example of the configuration of an I/O cell, to which a clock signal is input, according to the Third Embodiment of the present invention. FIG. 13 is an explanatory view showing an operation example of a delay adjustment circuit provided in the I/O cell of FIG. 12.

In the Third Embodiment, the I/O cell 89 has configuration, in which a delay adjustment circuit 34 is added to the same configuration as that of FIG. 11 of the Second Embodiment described above. The delay adjustment circuit 34 is constituted by inverters 35-40.

The inverters 35-37 and the inverters 38-40 are coupled in series, respectively. The output section of the input buffer 30 is coupled to the input section of the inverter 35, and the output section of the input buffer 31 is coupled to the input section of the inverter 38. A signal ZB is output from the output section of the inverter 37, while a signal Z is output from the output section of the inverter 40. The delay adjustment circuit 34 is a circuit that adjusts a delay time (eliminates a delay time difference) between a signal IN output from the input buffer 30 and a signal INB output from the input buffer 31.

Here, the operation of the delay adjustment circuit 34 is described.

FIG. 13 is a circuit diagram showing an example of the delay adjustment circuit 34.

Here, a case where the phases of differential input waveforms in the signals IN and INB input to the delay adjustment circuit 34 are shifted from each other, e.g. a case where the waveform of the signal INB enters late as compared with the signal IN, is described.

The inverters 35-40 each have a configuration, in which a P-channel MOS transistor and an N-channel MOS transistor are coupled in series, as shown in FIG. 13.

First, when the signals IN and INB as shown in the view are input to the delay adjustment circuit 34, the delay T3 that is a delay between the falling of the signal IN and the rising of the signal INB will transmit to an input section (node 1 of FIG. 12) of the inverter 36 and an input section (node 2 of FIG. 12) of the inverter 39.

During the delay T3, the signal INB is 'Low' (the signal IN is also 'Low'), and the node 1 is 'High' (the node 2 is also 'High'). Therefore, during the period of the delay T3, both the P-channel MOS transistor of the inverter 38 and the N-channel MOS transistor of the inverter 36 come into an ON state, and a shoot-through current (a dotted line of FIG. 12 indicates the path of the shoot-through current) flows from the node 2 to the node 3 (the input section of the inverter 37).

Then, when the waveform of the delayed signal INB arrives (the waveform rises), the P-channel MOS transistor of the inverter 38 is turned off and the shoot-through current stops. Because this shoot-through current acts so as to prevent the waveform, which arrived early, at the node 3 from falling, the shoot-through current is adjusted so that the falling of the waveform at the node 3 is delayed and so that the delay is reduced.

Moreover, the delay T4 between the rising of the waveform of the signal IN and the falling of the waveform of the signal INB is also adjusted with the same mechanism. (During the delay T4, both the N-channel MOS transistor of the inverter 38 and the P-channel MOS transistor of the inverter 36 come into an ON state, and a shoot-through current flows from the node 3 to the node 2).

Also when the phase of the signal IN is delayed, as with the described above, a shoot-through current flows between the node 1 and the node 4 (the input section of the inverter 40), and the early arriving signal is prevented from rising/falling and thus the delay is adjusted.

Note that, as shown in FIG. 12, when the delay adjustment circuit 34 is provided in the I/O cell 89, to which the clock signals DQS and DQSB are input, for the purpose of reducing the skew, the delay adjustment circuit is preferably provided also in the I/O cells 81-88 to which an input data signal that is not the differential signals is input.

In this case, the connection is made so that a signal output from the output section of the I/O cell 81(-88) is input to one input section of the delay adjustment circuit 34 and so that the determination signal of a signal output from the output section of the I/O cell 81(-88) is input to the other input section of the delay adjustment circuit 34.

Thus, according to the Third Embodiment, a higher effect of reducing the skew can be obtained by providing the delay adjustment circuit 34 in the I/O cell 89 of the Second Embodiment described above (FIG. 11).

The present invention of the present inventor has been described specifically based on the embodiments, but it is obvious that the present invention is not limited to the embodiments and various modifications are possible without departing from the scope of the invention.

What is claimed is:

1. A semiconductor integrated circuit device, comprising:
an external connection terminal receiving an input signal from the outside; and
a differential amplifier circuit coupled to the external connection terminal,
wherein the differential amplifier circuit includes a first differential input section receiving the input signal from the external terminal, a second differential input section receiving a reference voltage, and tail current source receiving a current of the first differential input section and a current of the second differential input section,
wherein a current on the first differential input section side is detected and fed back to the tail current source so as to control a tail current flowing through the tail current source, and
wherein the current on the first differential input section side is converted to a voltage by means of a resistor and fed back to the tail current source.

2. A semiconductor integrated circuit device, comprising:
an external connection terminal receiving an input signal from the outside;
a differential amplifier circuit coupled to the external connection terminal;
a first and a second transistor constituting the first differential input section and the second differential input section, respectively;
a third transistor used as the tail current source of the first and second transistors; and
a current detection section detecting a current flowing through the first transistor,
wherein the differential amplifier circuit includes a first differential input section receiving the input signal from the external terminal, a second differential input section receiving a reference voltage, and a tail current source receiving a current of the first differential input section and a current of the second differential input section, wherein a current on the first differential input section side is detected and fed back to the tail current source so as to control a tail current flowing through the tail current source, and wherein the third transistor controls a current amount of the tail current in the tail current source based on a current which the current detection section detects.

3. The semiconductor integrated circuit device according to claim 2, wherein the current detection section includes a resistor for converting the current flowing through the first transistor to a voltage, and wherein the third transistor controls the current amount of the tail current in the tail current source based on the voltage to which the resistor has converted.

4. The semiconductor integrated circuit device according to claim 2, further comprising a fourth transistor coupled between the third transistor and a power supply line to which a power supply voltage is applied, and having a gate to which an operation enabling signal to allow an operation of the differential amplifier circuit is input, wherein the fourth transistor, when the operation enabling signal is active, is turned on to make the differential amplifier circuit operate.

5. The semiconductor integrated circuit device according to claim 1, further comprising a delay time adjustment circuit to which an output signal output from the differential amplifier circuit and an inverted signal of the output signal are input, respectively, and which adjusts so that a delay difference between the output signal and the inverted signal is substantially eliminated, and outputs the output signal and the inverted signal.

6. A semiconductor integrated circuit device, comprising:

a first external connection terminal receiving a first signal of differential signals;

a second external connection terminal receiving a second signal that is an inverted signal of the first signal of the differential signals;

a first differential amplifier circuit including a first differential input section receiving the first signal from the first external connection terminal and a second differential input section receiving a reference voltage, the first differential amplifier circuit carrying out a differential amplification of the first signal and the reference voltage; and a second differential amplifier circuit including a third differential input section receiving the second signal from the second external connection terminal and a fourth differential input section receiving the reference voltage, the second differential amplifier circuit carrying out a differential amplification of the second signal and the reference voltage, wherein the first differential amplifier circuit detects a current on the first differential input section side, and feeds this back to a first tail current source of the first differential amplifier circuit to control a tail current in the first tail current source, and wherein the second differential amplifier circuit detects a current on the third differential input section side, and feeds this back to a second tail current source of the second differential amplifier circuit to control the second tail current.

7. The semiconductor integrated circuit device according to claim 6, wherein the first differential amplifier circuit converts a current on the first differential input section side to a voltage by means of a resistor, and feeds this back to the first tail current source, and wherein the second differential amplifier circuit converts a current generated in the third differential input section to a voltage by means of a resistor, and feeds this back to the second tail current source.

8. A semiconductor integrated circuit device, comprising:

a first external connection terminal receiving a first signal of differential signals;

a second external connection terminal receiving a second signal that is an inverted signal of the first signal of the differential signals;

a first differential amplifier circuit including a first differential input section receiving the first signal from the first external connection terminal and a second differential input section receiving a reference voltage, the first differential amplifier circuit carrying out a differential amplification of the first signal and the reference voltage; and a second differential amplifier circuit including a third differential input section receiving the second signal from the second external connection terminal and a fourth differential input section receiving the reference voltage, the second differential amplifier circuit carrying out a differential amplification of the second signal and the reference voltage, wherein the first differential amplifier circuit includes a fifth and a sixth transistor constituting the first differential input section and the second differential input section, respectively, a seventh transistor coupled to the fifth and sixth transistors to constitute the first tail current source, and a first current detection section detecting a current flowing through the fifth transistor, wherein the seventh transistor controls a current amount of a tail current flowing through the seventh transistor based on the current which the first current detection section detects, wherein the second differential amplifier circuit includes an eighth and a ninth transistor constituting the third differential input section and the fourth differential input section, respectively, a tenth transistor coupled to the eighth transistor and the ninth transistor to constitute the second tail current source, and a second current detection section detecting a current flowing through the tenth transistor, and wherein the tenth transistor controls a current amount of a tail current flowing through the tenth transistor based on the current which the second current detection section detects.

9. The semiconductor integrated circuit device according to claim 8, wherein the first current detection section includes a first resistor for converting the current flowing through the fifth transistor to a voltage, wherein the seventh transistor controls the current amount of the tail current flowing through the seventh transistor based on the voltage to which the first resistor has converted, wherein the second current detection section includes a second resistor for converting the current flowing through the eighth transistor to a voltage, and wherein the tenth transistor controls the current amount of the tail current flowing through the tenth transistor based on the voltage to which the second resistor has converted.

10. The semiconductor integrated circuit device according to claim 8,
wherein the first differential amplifier circuit includes an eleventh transistor coupled between the seventh transistor and a power supply line to which a power supply voltage is applied, and having a gate to which an operation enabling signal to allow an operation of the input buffer is input,
wherein the second differential amplifier circuit includes a twelfth transistor coupled between the tenth transistor and a power supply line to which a power supply voltage is applied, and having a gate to which the operation enabling signal is input,
wherein the eleventh transistor, when the operation enabling signal is active, is turned on to make the first differential amplifier circuit operate, and
wherein the twelfth transistor, when the operation enabling signal is active, is turned on to make the second differential amplifier circuit operate.

11. The semiconductor integrated circuit device according to claim 8, further comprising a delay time adjustment circuit, to which an output signal output from the first differential amplifier circuit and an inverted signal output from the second differential amplifier circuit are input, respectively, and which adjusts so that a delay difference between the output signal and the inverted signal is substantially eliminated, and outputs the output signal and the inverted signal.

12. A semiconductor integrated circuit device, comprising:
an external connection terminal receiving an input signal from the outside; and
a differential amplifier circuit coupled to the external connection terminal and including a first differential input section receiving an input signal from the external connection terminal, and a second differential input section receiving a reference voltage,
wherein the differential amplifier circuit includes a first and a second load element, a first and a second input transistor, and a tail transistor,
wherein gate terminal of the first input transistor is coupled to the first differential input section,
wherein a gate terminal of the second input transistor is coupled to the second differential input section,
wherein a drain terminal of the first input transistor and a first conduction terminal of the first load element are electrically coupled to each other,
wherein a drain terminal of the second input transistor and a first conduction terminal of the second load element are electrically coupled to each other,
wherein other end of a first resistor and other end of a second resistor are coupled to a first power supply line to which a first power supply voltage is supplied,
wherein source terminals of the first and second input transistors are coupled to a second power supply line to which a second power supply voltage is supplied via the tail transistor,
wherein one end of the first resistor is coupled to a gate terminal of the transistor, and
wherein the external connection terminal is coupled to a memory chip that transfers data in synchronization with rising and falling of a clock signal.

13. The semiconductor integrated circuit device according to claim 3, further comprising a fourth transistor coupled between the third transistor and a power supply line to which a power supply voltage is applied, and having a gate to which an operation enabling signal to allow an operation of the differential amplifier circuit is input,
wherein the fourth transistor, when the operation enabling signal is active, is turned on to make the differential amplifier circuit operate.

14. The semiconductor integrated circuit device according to claim 13, further comprising a delay time adjustment circuit to which an output signal output from the differential amplifier circuit and an inverted signal of the output signal are input, respectively, and which adjusts so that a delay difference between the output signal and the inverted signal is substantially eliminated, and outputs the output signal and the inverted signal.

15. The semiconductor integrated circuit device according to claim 3, further comprising a delay time adjustment circuit to which an output signal output from the differential amplifier circuit and an inverted signal of the output signal are input, respectively, and which adjusts so that a delay difference between the output signal and the inverted signal is substantially eliminated, and outputs the output signal and the inverted signal.

16. The semiconductor integrated circuit device according to claim 4, further comprising a delay time adjustment circuit to which an output signal output from the differential amplifier circuit and an inverted signal of the output signal are input, respectively, and which adjusts so that a delay difference between the output signal and the inverted signal is substantially eliminated, and outputs the output signal and the inverted signal.

17. The semiconductor integrated circuit device according to claim 1, further comprising a delay time adjustment circuit to which an output signal output from the differential amplifier circuit and an inverted signal of the output signal are input, respectively, and which adjusts so that a delay difference between the output signal and the inverted signal is substantially eliminated, and outputs the output signal and the inverted signal.

18. The semiconductor integrated circuit device according to claim 2, further comprising a delay time adjustment circuit to which an output signal output from the differential amplifier circuit and an inverted signal of the output signal are input, respectively, and which adjusts so that a delay difference between the output signal and the inverted signal is substantially eliminated, and outputs the output signal and the inverted signal.

19. The semiconductor integrated circuit device according to claim 9,
wherein the first differential amplifier circuit includes an eleventh transistor coupled between the seventh transistor and a power supply line to which a power supply voltage is applied, and having a gate to which an operation enabling signal to allow an operation of the input buffer is input,
wherein the second differential amplifier circuit includes a twelfth transistor coupled between the tenth transistor and a power supply line to which a power supply voltage is applied, and having a gate to which the operation enabling signal is input,
wherein the eleventh transistor, when the operation enabling signal is active, is turned on to make the first differential amplifier circuit operate, and
wherein the twelfth transistor, when the operation enabling signal is active, is turned on to make the second differential amplifier circuit operate.

20. The semiconductor integrated circuit device according to claim 19, further comprising a delay time adjustment circuit, to which an output signal output from the first differential amplifier circuit and an inverted signal output from the second differential amplifier circuit are input, respectively, and which adjusts so that a delay difference between the output signal and the inverted signal is substantially eliminated, and outputs the output signal and the inverted signal.

21. The semiconductor integrated circuit device according to claim 9, further comprising a delay time adjustment circuit, to which an output signal output from the first differential amplifier circuit and an inverted signal output from the second differential amplifier circuit are input, respectively, and which adjusts so that a delay difference between the output signal and the inverted signal is substantially eliminated, and outputs the output signal and the inverted signal.

22. The semiconductor integrated circuit device according to claim 10, further comprising a delay time adjustment circuit, to which an output signal output from the first differential amplifier circuit and an inverted signal output from the second differential amplifier circuit are input, respectively, and which adjusts so that a delay difference between the output signal and the inverted signal is substantially eliminated, and outputs the output signal and the inverted signal.

* * * * *